(12) United States Patent
Rhodes

(10) Patent No.: US 11,415,604 B2
(45) Date of Patent: Aug. 16, 2022

(54) DYNAMIC CONNECTION INDICATION

(71) Applicant: Baker Hughes Oilfield Operations LLC, Houston, TX (US)

(72) Inventor: Brian Rhodes, Leicester (GB)

(73) Assignee: BAKER HUGHES OILFIELD OPERATIONS LLC, Houston, TX (US)

(*) Notice: Subject to any disclaimer, the term of this patent is extended or adjusted under 35 U.S.C. 154(b) by 52 days.

(21) Appl. No.: 17/038,002

(22) Filed: Sep. 30, 2020

(65) Prior Publication Data
US 2022/0099705 A1     Mar. 31, 2022

(51) Int. Cl.
*G01R 15/12* (2006.01)
*G01R 1/067* (2006.01)

(52) U.S. Cl.
CPC ....... *G01R 15/125* (2013.01); *G01R 1/06766* (2013.01); *G01R 1/06772* (2013.01); *G01R 1/06788* (2013.01)

(58) Field of Classification Search
CPC .............. G01R 15/125; G01R 1/06766; G01R 1/06788
See application file for complete search history.

(56) References Cited

U.S. PATENT DOCUMENTS

| | | | |
|---|---|---|---|
| 4,356,509 A * | 10/1982 | Skerlos | H04M 1/56 348/552 |
| 6,043,668 A | 3/2000 | Carney | |
| 6,361,356 B1 | 3/2002 | Heberlein et al. | |
| 6,439,922 B1 | 8/2002 | Laurer et al. | |
| 7,126,325 B2 * | 10/2006 | Zhang | G01F 15/125 324/110 |
| 8,206,175 B2 | 6/2012 | Boyd et al. | |
| 8,456,153 B2 * | 6/2013 | Garland | G01R 15/125 324/141 |
| 9,568,504 B2 * | 2/2017 | Cabot | G01R 15/09 |

FOREIGN PATENT DOCUMENTS

| | | |
|---|---|---|
| CN | 203300824 U | 11/2013 |
| JP | 2001068174 A | 3/2001 |
| JP | 2011009427 A | 1/2011 |

OTHER PUBLICATIONS

Gurries Mark, "Wiring: Standardizing Color and Connections", Sep. 27, 2014.

* cited by examiner

*Primary Examiner* — Paresh Patel
(74) *Attorney, Agent, or Firm* — Mintz, Levin, Cohn, Ferris, Glovsky and Popeo, P.C; Lisa Adams

(57) ABSTRACT

Systems, methods, and a computer readable medium are provided herein for providing an indication of a connection terminal on a measurement device for use in performing a test of a target device. The system can include a target device and a measurement device. The measurement device can couple to the target device via a plurality of connection terminals to perform a test of the target device. The measurement device can receive an input identifying a test to be performed on the target device by the measurement device. The measurement device can determine, based on the received input, an indication identifying at least one connection terminal of the plurality of connection terminals to connect to the target device to perform the test. The measurement device can provide the indication of the at least one connection terminal via an indication mechanism associated with the at least one connection terminal.

21 Claims, 3 Drawing Sheets

DYNAMIC CONNECTION INDICATION

BACKGROUND

Electrical instruments can be configured to provide a range of functionality for monitoring or testing electrical systems, devices, and/or components of the electrical systems and devices. Monitoring systems, calibration equipment, and test and measurement devices are examples of electrical instruments that can each be communicatively coupled to an object or device under test to evaluate the operation and performance of the object or device. An object or device can be evaluated by connecting the electrical instrument to the object or device under test via one or more connections terminals configured within the electrical instrument. Determining an appropriate connection terminal to use when connecting an electrical instrument to a device under test can be difficult and prone to user error.

SUMMARY

In one aspect, a system is provided. In one embodiment, the system can include a target device and a measurement device. The measurement device can be configured to couple to the target device via a plurality of connection terminals to perform a test of the target device. The measurement device can include a display, at least one data processor, and a memory storing computer readable instructions and a plurality of tests. The instructions when executed by the at least one data processor can cause the at least one data processor to perform operations including receiving an input identifying a test to be performed on the target device by the measurement device. The instructions can further cause the at least one data processor to determine, based on the received input, an indication identifying at least one connection terminal of the plurality of connection terminals to connect to the target device to perform the test. The instructions can further cause the at least one data processor to provide the indication of the at least one connection terminal via an indication mechanism associated with the at least one connection terminal.

Methods and non-transitory computer program products (i.e., physically embodied computer program products) that store instructions, which when executed by one or more data processors of one or more computing systems, causes at least one data processor to perform operations according to the methods herein are also described. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

DESCRIPTION OF DRAWINGS

These and other features will be more readily understood from the following detailed description taken in conjunction with the accompanying drawings, in which.

Figure 1:
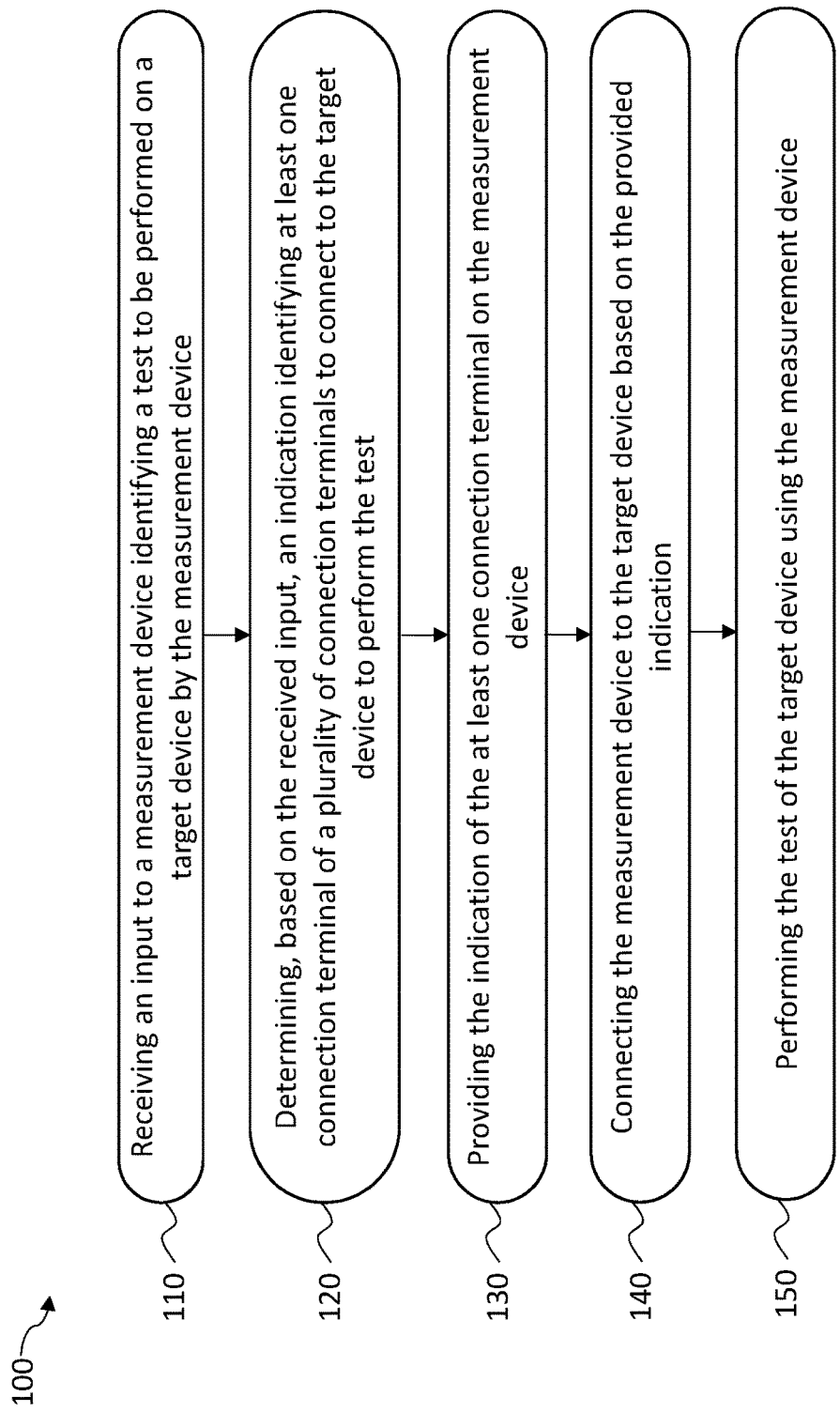
FIG. 1 is a process flow diagram illustrating an example process for providing an indication of a connection terminal on a measurement device according to some implementations of the current subject matter.

It is noted that the drawings are not necessarily to scale. The drawings are intended to depict only typical aspects of the subject matter disclosed herein, and therefore should not be considered as limiting the scope of the disclosure.

DETAILED DESCRIPTION

Electronic devices can be used to connect to a target device and to perform a test characterizing an operation of the target device. The electronic devices can include test and measurement devices, calibration devices, monitoring systems, or the like, which can connect to the target device via one or more connection terminals configured on the electronic device performing the test. Depending on the type of test to be performed and the type of target device being evaluated, a variety of different connection configurations can be required to be made connecting the target device to the measurement device. The outcome of the test and the accuracy of the test results characterizing the operation of the target device depend on properly forming the connections between the target device and the measurement device.

When performing a test, a measurement device user must recognize the configuration of connection terminals on the measurement device and select one or more connection terminals to connect to the target device being tested based on the type of test to be performed. Measurement devices can be configured with a large variety of tests. As a result, a user can be required to understand and implement a large number of connection configurations using one or more of the connection terminals configured on the measurement device. For example, process calibration equipment can be configured to perform a number of electrical tests, typically sourcing and measuring voltages and currents in several different modes of operation. As a result, the process calibration equipment can include a large number of connection terminals. For each test type, a user can be required to connect the target device to be tested to the process calibration equipment using the appropriate connection terminals required for the particular test being performed.

Manual connection configuration can be error prone as users may incorrectly connect the wrong connection terminal to the target device being tested. Measurement device users typically rely on the measurement device handbook or labeling provided on a front panel of the measurement device to inform them of the appropriate connection terminals to couple to the target device. As the number of available tests grow, the labelling and configuration of the connection terminals can be increasingly complex. As a result, measurement device users must increasingly rely on device handbooks, or other documentation prior to performing less common tests. Some measurement devices can include a graphical user interface (GUI) providing information about a particular test and the connections required to perform the test. When test information is provided on a GUI, the presentation of the test and connection information can often obscure other information needed for a user to operation the measurement device. A user must still interpret the connection information provided via the GUI and manually configure the appropriate connection terminals required for the test. As a result of these limitations to efficiently indicate an appropriate connection between a measurement device and a target device, mistakes in connection terminal configurations can be common. Connection errors can cause delays in performing the test, erroneous device readings, and/or can damage the measurement device and/or the target device. In extreme cases, the connection errors can create safety issues for the users of the measurement devices. Thus, improved systems and methods for indicating appropriate connection terminals in a measurement device are desired.

An example system and methods for providing an indication of a connection terminal on a measurement device are provided herein. The system and methods herein can be configured to inform a user of the measurement device of the proper connection terminal to be used when connecting the measurement device to the target device to perform a test of the target device. For example, the system and methods described herein can provide indicator mechanisms in proximity of one or more connection terminals of the measurement device or within a GUI configured within a display of the measurement device. The indicator mechanisms can indicate to an appropriate connection terminal to be used with respect to a particular test being performed on the target device using the measurement device. As a result, the user can connect the appropriate connection terminal of the measurement device to the target device and connection errors can be mitigated.

FIG. 1 is a process flow diagram illustrating an example process 100 for providing an indication of a connection terminal on a measurement device according to some implementations of the current subject matter. At 110, a data processor of the measurement device can receive an input identifying a test to be performed on a target device. The test can be performed by the measurement device. The input can be received as a selection of a test from a plurality of tests stored in a memory of the measurement device for which the measurement device is configured to perform. The number and scope of the plurality of tests can be configured based on the type of the measurement device. In some embodiments, the input can be received on a GUI of the measurement device displaying a list of tests. In some embodiments, the input can be received via a selector switch configured on the measurement device. In some embodiments, the input can be received programmatically from a remote computer that is communicatively linked to the measurement device. The input can be provided by a user associated with and/or operating the measurement device.

At 120, the data processor of the measurement device can determine, based on the input received at 110, an indication identifying at least one connection terminal of a plurality of connection terminals to connect to the target device to perform the test. For example, responsive to receiving an input to test or otherwise measure the performance of a sensor, the data processor of the measurement device can determine a configuration of connection terminals to be connected to the target device to measure the output voltage from the sensor. The memory of the measurement device can store a test connection table or similar data structure mapping connection terminal configurations to tests, such that the test connection table can be accessed to determine an appropriate connection terminal configuration associated with the input identifying the test received at operation 110. In some embodiments, the data processor can infer one or more secondary connection terminal configurations based on the received input and an initial connection terminal configuration performed by the user.

At 130, the data processor of the measurement device can provide the indication of the at least one connection terminal on the measurement device. The measurement device can include a variety of indicator mechanisms to provide the indication of the appropriate connection terminal to be connected to the target device based on the test to be performed. For example, the measurement device can include a light, such as a light emitting diode, or similar illuminating component, to provide the indication. In some embodiments, the indication can be provided on a display of the measurement device, such as a portion of the display configured on the measurement device. For example, the portion of the display can include a border of the display that can be configured to illuminate. In some embodiments, the illuminating component associated with a connection terminal can be included in an active portion of the display. In some embodiments, the indication can be provided audibly from a speaker configured within the measurement device. In some embodiments, the indication can be provided visibly and audibly by the measurement device.

At 140, responsive to receiving the indication of the connection terminal on the measurement device, a user can connect the indicated connection terminal to the target device via a test lead. At 150, the user can perform the test of the target device using the measurement device.

Figure 2:
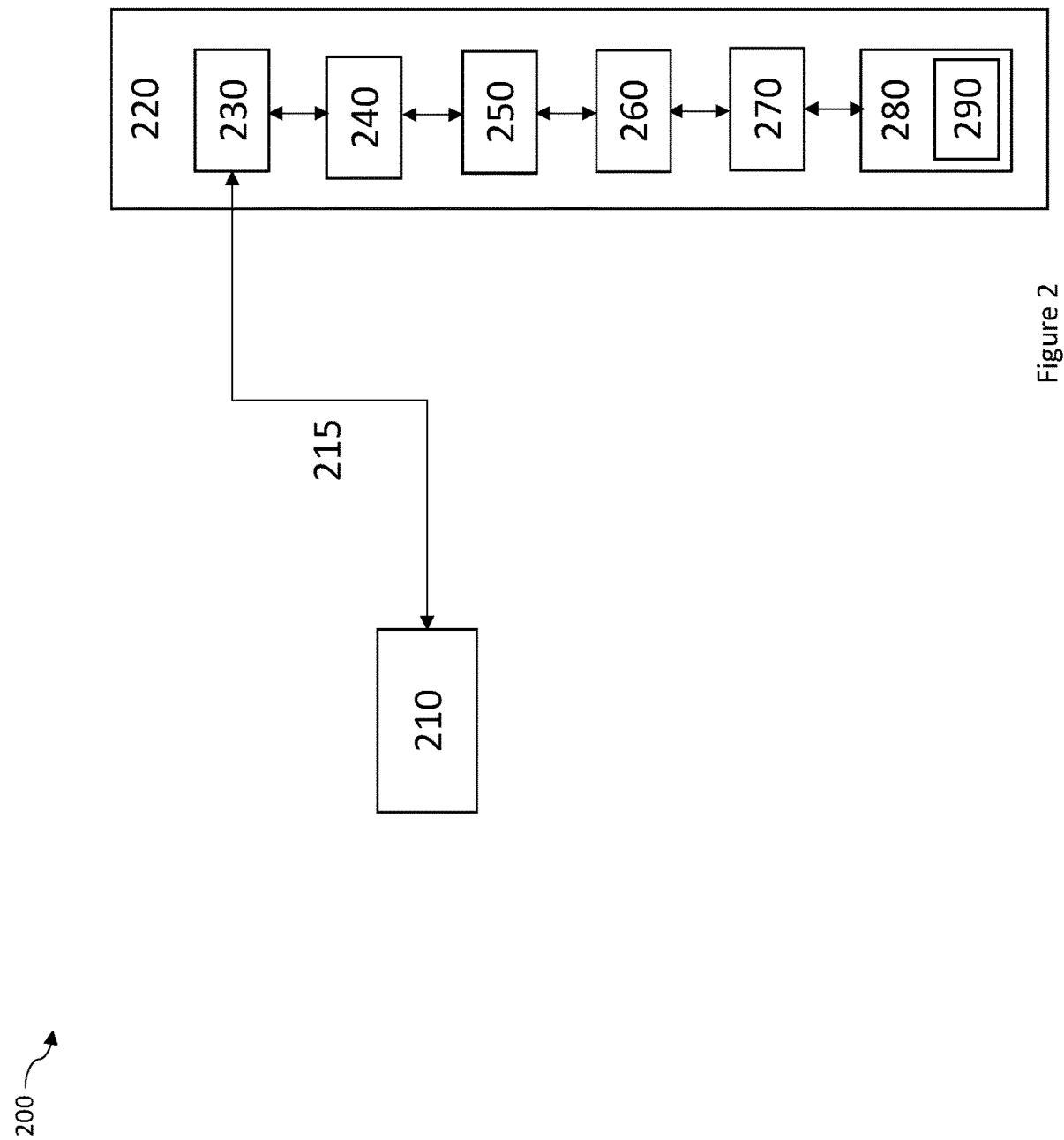
FIG. 2 is a block diagram illustrating an example system performing the process of FIG. 1 according to some implementations of the current subject matter.

FIG. 2 is a block diagram illustrating an example system 200 for performing the process of FIG. 1 according to some implementations of the current subject matter. The system 200 includes a target device 210 and a measurement device 220. The measurement device can be coupled to the target device via one or more leads 215 responsive to receiving an indication of a connection terminal associated with a test to be performed on the target device 210 by the measurement device 220. The target device 210 can include a variety of non-limiting sensing devices. In some embodiments, the target device 210 can include a sensor, such as a pressure sensor configured to monitor a fuel line pressure or a temperature sensor configured to monitor an exhaust manifold temperature. The target devices, e.g., the sensors, can be configured to convert a physical parameter (e.g., a pressure, a temperature, a mass-flow, or the like) into an electrical signal. The electrical signal can be monitored using the measurement device 220. This electrical signal can take several forms, for example a voltage, a current, a frequency, a power setting, a switch output, and/or a digital protocol. The measurement device can be configured based on the physical parameter. For example, a voltage output sensor 210 needs to be connected to the voltage measurement terminals on the measurement device 220 irrespective if it is also measuring temperature or pressure.

The measurement device 220 can be configured to perform the method 100 of FIG. 1 with regard to any number of target devices 210. In some embodiments, the measurement device can include one of a calibration device, a signal generator, a source power generator, a voltage meter, an oscilloscope, an ohmmeter, an ammeters, a capacitance meter, an EMF meter, a digital pattern generator, a pulse generator, a multimeter, a test probe, or a frequency counter. The measurement device 220 can include a variety of non-limiting electrical equipment including a plurality of connection terminals used to test or measure performance of a target device. For example, in some embodiments, the measurement device 220 can include a computing device with multiple identical or different connection terminals communicatively coupled to the computing device.

The measurement device 220 can include a plurality of connection terminals 230. Each of the connection terminals 230 can be configured as a 4 mm connection terminal, a serial connection terminal, a universal serial bus (USB) connection terminal, a thermocouple connector, a Bayonet-Neill-Concelman (BNC) connector, a coaxial connector, a binding post, a screw terminal, a quick connect fitting, or a pipe connection. In some embodiments, the connection terminal can be a connection terminal associated with a hydraulic connection or a pneumatic connection. In some embodiments, 1, 2, 3, 4, 5, 6, 7, 8, 9, 10-12, or 10-15 connection terminals can be configured on the measurement device 220. In some embodiments, a combination of two or more connection terminals can be included in the measurement device 220. A particular test to be performed using the measurement device 220 can utilize a combination of connection terminals without limitation.

In some embodiments, the measurement device 220 can simulate a target device 210. For example, the measurement device 220 can be used in place of a target device 210, such as a pressure sensor. The measurement device 220 can simulate the pressure sensor 210 to confirm that the measurement device 220 operates as expected and displays the appropriate data on a display of the measurement device 220.

As further shown in FIG. 2, the measurement device 220 can include a memory 240. The memory 240 can store test data, such as a test connection table or data structure mapping connection terminals to individual tests. The test connection table can include indicator mechanism data configured to determine how to identify the appropriate connection terminal based on an input selecting a particular test. The memory 240 can also store computer-readable, executable instructions to perform the method 100 described in relation to FIG. 1. In some embodiments, the memory 240 can store alarm instructions and/or alarm configuration data or rules that can be triggered in response to improperly connecting a connection terminal for a particular test.

The measurement device 220 can also include a data processor 250. The data processor 250 can be configured to read and/or execute the computer-readable instructions stored in the memory 240, which cause the processor 250 to perform the operations described in process 100 of FIG. 1. The measurement device 220 can further include an input device 260. The input device can include a keyboard, a mouse, a trackball, a stylus, a rotary selector switch, a push-button selector switch, or the like configured to receive input selections from a user to select a test to be performed using the measurement device. The measurement device 220 can also include an output device 270. In some embodiments, the output device 270 can include a speaker. In some embodiments, the speaker can be utilized to provide audible indications of correct or incorrect connection terminal configurations. The measurement device can further include a display 280 configured to provide a GUI 290. The GUI 290 can display visualizations of the connection terminals and can provide indications of the appropriate connection terminal to connect to the target device 210 based on the user input received identifying a particular test to perform. In some embodiments, the display 280 or the GUI 290 can provide visible, graphical indications of correct or incorrect connection terminal configurations. For example, the GUI can be configured to provide a visualization emulating the physical connection terminals configured on the measurement device 220. In some embodiments, the display 280 can encompass or otherwise surround one or more of the connection terminals 230, such that indication could be provided via the display next to one of the connection terminals 230. For example, the display 280 can include a hole formed through the display and one of the connection terminals 230 can be configured within the hole formed through the display. The display 280 can be configured to include an indication mechanism next to or surrounding one or more of the connection terminals 230. In some embodiments, the display 280 can include a touch-screen display and user input can be provided to the measurement device 220 via the touch-screen display 280. In some embodiments, the display 280 or the GUI 290 can be configured to provide one or more alarms associated with incorrect connection terminal configurations when connecting the measurement device 220 to the target device 210 via the leads 215.

Figure 3:
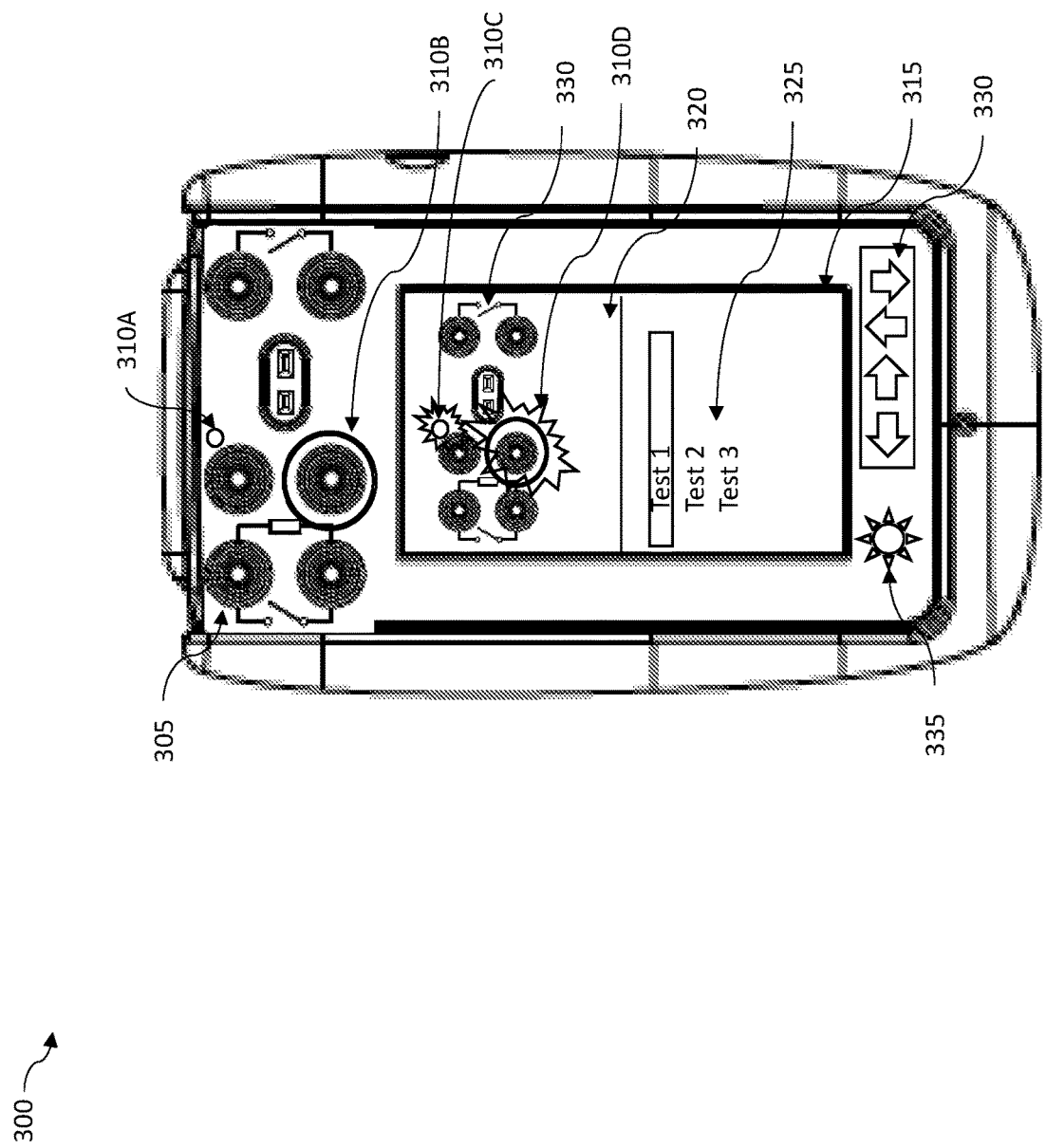
FIG. 3 is a diagram of an example measurement device configured to perform the process of FIG. 1 according to some implementations of the current subject matter.

FIG. 3 is a diagram of an example measurement device 300 configured to perform the process of FIG. 1 according to some implementations of the current subject matter. The measurement device 300 shown in FIG. 3 corresponds to the measurement device 220 described in relation to FIG. 2. As shown in FIG. 3, the measurement device 300 can include a plurality of connection terminals 305. Each of the connection terminals 305 can receive a test lead, such as the test lead 215 shown in FIG. 2, to couple the measurement device 220 to the target device 210 being tested.

The measurement device 300 can also include one or more indication mechanisms 310 to provide an indication of a particular connection terminal 305 to be connected to the target device 210. For example, indication mechanism 310A can include a light emitting diode (LED) or similar illumination component that is configured next to or in proximity of the connection terminal 305 to which it is associated. The indication mechanism 310A can be positioned above, below, to the side, or even within the connection terminal 310A. In some embodiments, the indication mechanism 310 can include a ring-shape LED or similar illumination component surrounding the connection terminal 305. An example of the ring-shaped LED indication mechanism is shown as 310B.

In some embodiments, the indication mechanisms 310 can be configured to provide a user with visual feedback regarding the use of a particular connection terminal as well as the status of the connection. For example, upon selecting a test to perform, one or more of the indication mechanisms 310 can be configured to illuminate to indicate to the appropriate connection terminal 305 to be connected to the target device 210. A variety of non-limiting static or animation behaviors can be configured within the illumination of the indication mechanisms 310. The illumination of the indication mechanism 310 can identify the appropriate connection terminal to be connected to the target device and/or to provide status regarding the connection. For example, the indicator mechanisms 310 can emit light in one or more flashing illumination patterns or a consistent, non-flashing illumination pattern. The flashing illumination patterns can include one or more illuminations that are pattern associated with the test to be performed and/or the connection terminal to be connected. In some embodiments, the indication mechanisms can be configured to provide the indication using one or more colors. For example, one color may be provided to indicate a polarity of the connection. A second color can be provided to indicate a connection method associated with a particular selected test to be performed. In some embodiments, different colors can be used to represent sequential connections and corresponding connection terminals to be connected in sequence. In some embodiments, different colors can be used to indicate a connection function, such as a power, a signal, or a polarity of the connection.

As further shown in FIG. 3, the measurement device 300 can include a display 315. The display 315 can be configured to provide a GUI 320. The GUI 320 can provide one or more tests 325 to be performed, such as a list of tests as shown. Responsive to a user selecting a test, the GUI 325 can provide an emulated view 330 of the connection terminals configured on the measurement device 300. For example, as shown in FIG. 3, a user has selected "Test 1" from the list of tests. The GUI 320 can provide, in response to the selection of Test 1, an emulated view 330 in the GUI 320 displaying the connection terminals to be connected to the target device 310 that are associated with performing Test 1. Responsive to the selection of Test 1, the indication mechanism 310C may illuminate or provide an animated visual indication, such as a flashing illumination, to indicate that the connection terminal associated with indication mechanism 310A should be connected to the target device 220. Similarly, performing Test 1 could additionally require the connection terminal associated with indication mechanism 310B to be connected to the target device 220. Responsive to selecting Test 1, the indication mechanism 310D, may illuminate or provide an animated visual indication, such as a flashing illumination, to indicate that the connection terminal associated with the indication mechanism 310B should be connected to the target device 220.

As further shown in FIG. 3, in some embodiments, the measurement device 300 can include one or more push-button selectors 330. For example, the push-button selectors 330 can include up, down, left, and right push-button selectors. In some embodiments, the push-button selectors 330 can include + (plus) and − (minus) push button selectors. As further shown in FIG. 3, the measurement device 300 can include a rotary selector 335. The push-button selectors 330 and/or the rotary selector 335 can be used to provide a test selection input to the measurement device 300.

Exemplary technical effects of the methods, systems, and computer-readable medium described herein include, by way of non-limiting example, providing an indication of a connection terminal to be used to connect a measurement device to a target device for performing a test of the target device. The measurement device can provide a more easily readable, intuitive, interactive indication of an appropriate connection terminal to use when configuring the measurement device to perform the test of the target device. Providing an accurate indication of a proper connection terminal to utilize when testing a target device can enable faster, more accurate measurements of target devices and can eliminate human error when configuring connection terminals for use testing the target device. The system, devices, and computer-readable medium configured to perform the methods described herein can provide more accurate diagnosis of target device operation and thus enable more robust operation of systems in which the target devices are utilized. The system, devices, and computer-readable medium described herein can also include improved user interfaces for providing an indication of appropriate connection terminals to be used during target device testing.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment can be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, can be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language can correspond to the precision of an instrument for measuring the value. Here and throughout the specification and claims, range limitations can be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. A method comprising:
   receiving, by a data processor of a measurement device, an input to the measurement device identifying a test to be performed on a target device by the measurement device, the measurement device including a display including a graphical user interface providing an emulated view of a plurality of connection terminals of the measurement device configured to connect the measurement device to the target device to perform the test;
   providing, based on the received input, the emulated view of the plurality of connection terminals via the graphical user interface;
   determining, by the data processor and based on the received input, an indication identifying at least one connection terminal of the plurality of connection terminals to connect to the target device to perform the test; and
   providing, by the data processor, the indication of the at least one connection terminal via an indication mechanism associated with the at least one connection terminal.

2. The method of claim 1, further comprising
   connecting the measurement device to the target device based on the provided indication; and
   performing the test of the target device using the measurement device.

3. The method of claim 1, wherein the measurement device comprises one of a calibration device, a signal generator, a source power generator, a voltage meter, an oscilloscope, an ohmmeter, an ammeters, a capacitance meter, an EMF meter, a digital pattern generator, a pulse generator, a multimeter, a test probe, or a frequency counter.

4. The method of claim 1, wherein the plurality of connection terminals include one or more of a 4 mm connection terminal, a serial connection terminal, a USB connection terminal, a thermocouple connector, a Bayonet-Neill-Concelman (BNC) connector, a coaxial connector, a binding post, a screw terminal, a quick connect fitting, or a pipe connection.

5. The method of claim 1, wherein the indication mechanism includes a light emitting diode and providing the indication comprises illuminating the light emitting diode via a flashing light pattern emitted from the light emitting diode.

6. The method of claim 5, wherein providing the indication illuminating the light emitting diode further comprises illuminating the light emitting diode with one or more colors.

7. The method of claim 6, wherein a first color of the one or more colors corresponds to a connection function.

8. The method of claim 6, wherein a second color of the one or more colors corresponds to a connection method associated with a connection between the measurement device and the target device, the connection method associated with the test to be performed on the target device.

9. The method of claim 1, wherein the input selecting the test to be performed on the target device is received from a user selecting the test via a rotary selector switch or a push-button selector switch configured on the measurement device.

10. A system comprising:
a target device;
a measurement device configured to couple to the target device via a plurality of connection terminals to perform a test of the target device, the measurement device comprising a display providing an emulated view of the plurality of connection terminals via a graphical user interface of the display, at least one data processor, and a memory storing computer readable instructions and a plurality of tests, the instructions when executed by at the least one data processor cause the at least one data processor to perform operations comprising:
receiving an input identifying a test to be performed on the target device by the measurement device;
providing, based on the received input, the emulated view of the plurality of connection terminals via the graphical user interface,
determining, based on the received input, an indication identifying at least one connection terminal of the plurality of connection terminals to connect to the target device to perform the test; and
providing the indication of the at least one connection terminal via an indication mechanism associated with the at least one connection terminal.

11. The system of claim 10, wherein responsive to providing the indication, performing the test further comprises
connecting the measurement device to the target device based on the provided indication; and
performing the test of the target device using the measurement device.

12. The system of claim 10, wherein the measurement device comprises one of a calibration device, a signal generator, a source power generator, a voltage meter, an oscilloscope, an ohmmeter, an ammeters, a capacitance meter, an EMF meter, a digital pattern generator, a pulse generator, a multimeter, a test probe, or a frequency counter.

13. The system of claim 10, wherein the plurality of connection terminals include one or more of a 4 mm connection terminal, a serial connection terminal, a thermocouple connector, a Bayonet-Neill-Concelman (BNC) connector, a coaxial connector, a binding post, a screw terminal, a quick connect fitting, or a pipe connection.

14. The system of claim 10, wherein the indication mechanism includes a light emitting diode and providing the indication comprises illuminating the light emitting diode via a flashing light pattern emitted from the light emitting diode.

15. The system of claim 14, wherein the light emitting diode is a ring-shaped light emitting diode surrounding the at least one connection terminal.

16. The system of claim 14, wherein providing the indication illuminating the light emitting diode further comprises illuminating the light emitting diode with a plurality of colors.

17. The system of claim 16, wherein a first color of the plurality of colors corresponds to a polarity of a connection between the target device and the measurement device.

18. The system of claim 16, wherein a second color of the plurality of colors corresponds to a connection method associated with a connection between the measurement device and the target device, the connection method associated with the test to be performed on the target device.

19. The system of claim 10, wherein the input selecting the test to be performed on the target device is received from a user selecting the test via a rotary selector switch or a push-button selector switch configured on the measurement device.

20. A non-transitory computer readable medium of a measurement device configured to connect to a target device and perform a test of the target device, the measurement device comprising a plurality of connection terminals and a display providing an emulated view of plurality of connection terminals via a graphical user interface of the display, the non-transitory computing readable medium storing instructions, which when executed by at least one data processor of the measurement device cause the at least one data processor to perform operations comprising:
receiving an input to the measurement device identifying a test to be performed on a target device by the measurement device by connecting the measurement device to the target device via the plurality of connection terminals to perform the test;
providing, based on the received input, the emulated view of the plurality of connection terminals via the graphical user interface,
determining, based on the received input, an indication identifying at least one connection terminal of the plurality of connection terminals to connect to the target device to perform the test; and
providing the indication of the at least one connection terminal via an indication mechanism associated with the at least one connection terminal.

21. The method of claim 16, wherein the light emitting diodes are illuminated in an illumination sequence corresponding to a connection sequence associated with the identified test.

* * * * *